United States Patent

Proebsting

[15] 3,657,560

[45] Apr. 18, 1972

[54] FREQUENCY-VARIABLE INSULATED GATE FIELD EFFECT RESISTOR

[72] Inventor: Robert J. Proebsting, Dallas, Tex.

[73] Assignee: Texas Instruments Incorporated, Dallas, Tex.

[22] Filed: Mar. 18, 1970

[21] Appl. No.: 20,677

[52] U.S. Cl. ..............................307/233, 307/295, 307/304

[51] Int. Cl. ..............................H03k 5/20

[58] Field of Search ..................307/205, 251, 279, 304, 233, 307/295

[56] References Cited

UNITED STATES PATENTS

| | | | |
|---|---|---|---|
| 3,548,388 | 12/1970 | Sonoda | 307/279 X |
| 3,495,096 | 2/1970 | Blachowicz et al. | 307/251 X |
| 3,480,796 | 11/1969 | Polkinghorn et al. | 307/304 X |
| 3,543,055 | 11/1970 | Stanes | 307/251 X |

*Primary Examiner*—Benjamin A. Borchelt
*Assistant Examiner*—R. Kinberg
*Attorney*—Samuel M. Mims, Jr., James O. Dixon, Andrew M. Hassell, Harold Levine, Melvin Sharp, Michael A. Sileo, Henry T. Olsen, John E. Vandigriff and Gary C. Honeycutt

[57] ABSTRACT

A frequency-variable resistor is comprised of a plurality of source-to-drain series connected, insulated gate field effect transistors. The source-to-drain interconnections are effectively coupled to ground through capacitors and the source contact of the first transistor and drain contact of the last transistor in the series provide the terminals of the resistor. Each of the gate contacts of the plurality of transistors is connected to a signal source of the same frequency, but of a different phase. The resistance of the field effect resistor is then linearly, inversely proportional to the frequency of the signal over a wide range, and extremely high resistances are achieved.

5 Claims, 4 Drawing Figures

| | A | Ā | B | B̄ | | $\phi_1$ | $\phi_2$ | $\phi_3$ |
|---|---|---|---|---|---|---|---|---|
| CL | | $J_2$ | $J_1$ | $K_1$ | $K_2$ | | | |
| $t_1$ | 1 | 0 | 0 | 1 | 1 | 1 | 0 | 0 |
| $t_2$ | 0 | 1 | 0 | 1 | 1 | 0 | 1 | 0 |
| $t_3$ | 0 | 1 | 1 | 0 | 1 | 0 | 0 | 1 |
| $t_4$ | 1 | 0 | 0 | 1 | 1 | 1 | 0 | 0 |
| $t_5$ | 0 | 1 | 0 | 1 | 1 | 0 | 1 | 0 |
| $t_6$ | 0 | 1 | 1 | 0 | 1 | 0 | 0 | 1 |

FREQUENCY-VARIABLE INSULATED GATE FIELD EFFECT RESISTOR

This invention relates to insulated gate field effect resistors, and more particularly, to an insulated gate field effect resistor which is linearly, inversely proportional to frequency over a wide range.

In the field of insulated gate semiconductor technology it is often desirable to have a high resistance (several magnitudes greater than a megohm, for example) which is inversely proportional to frequency and which is capable of being fabricated as part of an integrated circuit. The resistors employed presently in semiconductor integrated circuits are either diffused resistance regions or the channel of a metal-insulator-semiconductor field effect transistor. In order to achieve high resistances above a few million ohms, however, excessive areas on the semiconductor substrate are required. In addition, the resistances of these resistors and their relative accuracies are fixed at the time the circuit is fabricated and may not be adjusted in accordance with the circuit into which they are ultimately connected.

Devices which allow resistances, and hence voltage or current in a circuit in which such resistances are employed, to be linearly varied with frequency, often require complex and expensive circuitry, which cannot be readily fabricated as part of an integrated circuit, an in particular, not within a single semiconductor substrate.

It is therefore an object of the invention to provide a semiconductor resistor, the resistance of which is as high as several orders of magnitude greater than megohms.

It is another object of the invention to provide a semiconductor resistor, the accuracy of which is dependent only upon the accuracy of the frequency of a signal applied to it.

It is a further object of the invention to provide a semiconductor resistor, the resistance of which is linearly variable with frequency over a large range.

It is still another object of the invention to provide a high resistance insulated gate field effect resistor which is easily fabricated on the same semiconductor substrate, and as part of, an integrated circuit comprised of insulated gate field effect transistors.

A feature of the invention provides a linear current or voltage variance with frequency, and hence, provides a semiconductor gated field effect transducer device which is fabricated alone or as part of an integrated circuit on a single semiconductor substrate.

These and other objects and features are accomplished in accordance with the present invention by providing a frequency-variable resistor comprised of a plurality of source-to-drain series connected, insulated gate field effect transistors. The source-to-drain interconnections are coupled to ground through an effective capacitance which may be the internal capacitance of the field effect transistors, or separate capacitors formed by providing a metallization pattern over an area of the insulation layer above a portion of the substrate material. A contact coupled to the source region of the first transistor and a contact coupled to the drain region of the last transistor in the series provide the terminals of the resistor. Each of the gate contacts of the plurality of field effect transistors is connected to a signal source of a single frequency, but of a different phase. The effective resistance between the terminals of the resistor is linearly, inversely proportional to the frequency of the signal applied to the gates. Extremely high resistances, several orders of magnitude greater than megohms ($10^7$, $10^8$ or $10^9$ ohms, for example) are achieved of which the accuracy is dependent only upon the accuracy of the frequency of the applied signal. The resistance may thus be varied over a wide range by varying the frequency. Conversely, if resistance or current through the resistor is measured, one may determine the frequency of the signal being applied to the gates.

Further objects and advantages of the invention will be apparent from the detailed description and claims and from the accompanying drawings illustrative of the invention wherein:

The frequency-variable resistor of the invention is comprised of a plurality of source-to-drain series connected, insulated gate, field effect transistors, and means for applying a signal of a single frequency but of a different phase, sequentially, to the insulated gate of each of said transistors in the series whereby the effective resistance of the series varies inversely in accordance with the frequency of said applied signals. The effective resistance of the series is achieved by permitting the signals of different phases to be applied sequentially whereby charge is switched from one transistor in the series to a next transistor in the series in discrete quantities rather than a continuous flow.

The current ($I$) and the voltage ($V$) difference between the source of the first transistor in the series and the drain of the last transistor in the series represents the effective resistance ($R$) of the series, where $$R = V/I$$

The current ($I$) is equivalent to the charge transferred ($q$) times the frequency of the applied signal ($f$), thus $$R = V/qf$$

The charge ($q$), however, of the resistor of the invention is equivalent to the capacitance ($C$) of each effective capacitor, assuming they are all approximately equal, times the voltage ($V$) divided by the number of effective capacitors ($n$), thus $$R = n/Cf$$

Since the capacitance ($C$) and the number of effective capacitors ($n$) are fixed at the time an embodiment of the resistor of the invention is fabricated, the resistance of the series varies inversely in accordance with the frequency applied. The particular resistance which is desired for a particular frequency is thus achieved by fabricating a series of a particular capacitance. The number of transistors employed may be increased, and external capacitors may be fabricated in the same semiconductor substrate as the transistors, coupled to the source-to-drain series connections and ground, in order to achieve a higher resistance range. Terminals may also be formed, connected to the source-to-drain series connections, whereby capacitors may be added as part of peripheral devices or circuits. Effective resistances several orders of magnitude greater than megohms is therefore easily realized by an embodiment of the frequency-variable resistor of the invention as hereinafter described in detail.

Figure 1:
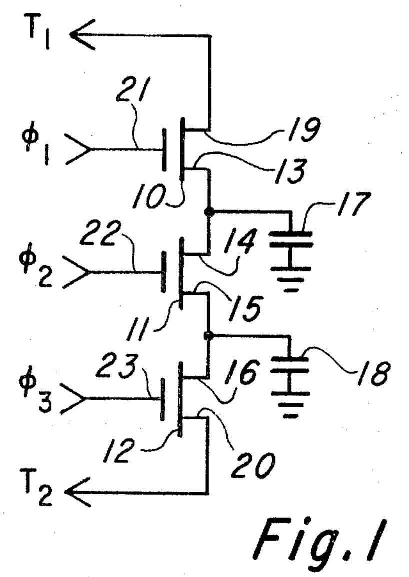
FIG. 1 illustrates a schematic circuit diagram of an embodiment of the frequency-variable resistor of the invention.

Referring now to the drawings, FIG. 1 illustrates an embodiment of the invention wherein three insulated gate, field effect transistors 10, 11 and 12 are connected in series.

Drain 13 of the first transistor 10 in the series is connected to source 14 of the second transistor 11 in the series and drain 15 of transistor 11 is connected to source 16 of the last transistor 12 in the series. Source 19 of transistor 10 and drain 20 of transistor 12 provide the terminals ($T_1$ and $T_2$, respectively) of the resistor. Effective capacitors 17 and 18 are coupled to the interconnections between drain 13 and source 14 and between drain 15 and source 16, respectively, and to ground. These effective capacitors may be the internal capacitances of the transistors as they are embodied in a single semiconductor substrate or, if such internal capacitance is insufficient to achieve a required resistance range, external capacitors formed as part of the same substrate or as part of peripheral devices or circuits. External capacitors are formed as part of the same substrate as the transistors by providing a metallization pattern over an area of the insulation layer above a portion of the substrate material. Both the internal capacitor and external capacitors formed as part of the same substrate material are hereinafter described in detail.

External capacitors which are part of peripheral devices or circuits are utilized when it is desirable not to fix the range of resistance variance for a given range of frequency variance at the time the resistor is fabricated. In order to connect such capacitors to the resistor, terminals must be provided as part of the connections between drain 13 and source 14 and between drain 15 and source 16.

Means $\phi_1$, $\phi_2$ and $\phi_3$ are provided for applying a signal of a single frequency but of a different phase sequentially to insulated gates 21, 22 and 23 of transistors 10, 11 and 12 respectively.

The difference in phase between the signals applied to the various gates is determined by dividing the period of the signal into a number of segments equal to the number of phases required which is also equivalent to the number of gates of the device or $(n + 1)$. By such procedure, a signal is sequentially applied to the gate of each transistor in the series. Thus, in the three-phase system described above, if a signal of $10^5$ pulses per second were applied to the gates, the period of such signal is $10^{-5}$ seconds, and the pulses of each phase would begin $10^{-5}$/seconds apart.

Current flows from $T_1$ to $T_2$ as follows: A pulse at $\phi_1$ allows the current to charge effective capacitor 17. Next, a pulse at $\phi_2$ allows effective capacitor 17 to transfer a portion of its charge to effective capacitor 18. A next pulse at $\phi_3$ allows the current to complete its flow through the resistor. For a given voltage applied across $T_1$ and $T_2$, the effective resistance between $T_1$ and $T_2$ is determined by the current flowing through the resistor according to the relation of resistance equaling voltage divided by current.

If effective capacitance of capacitors 17 and 18 were $10^{-13}$ farads, the effective resistance of the series, between terminals $T_1$ and $T_2$, would be $2 \times 10^{13}$ divided by the frequency of the signal applied to $\phi_1$, $\phi_2$ and $\phi_3$. A signal of $10^5$ Hz. produces an effective resistance of $2 \times 10^8$ ohms, while a signal of $10^4$ Hz. produces an effective resistance of $2 \times 10^9$ ohms.

Figures 2, 3:
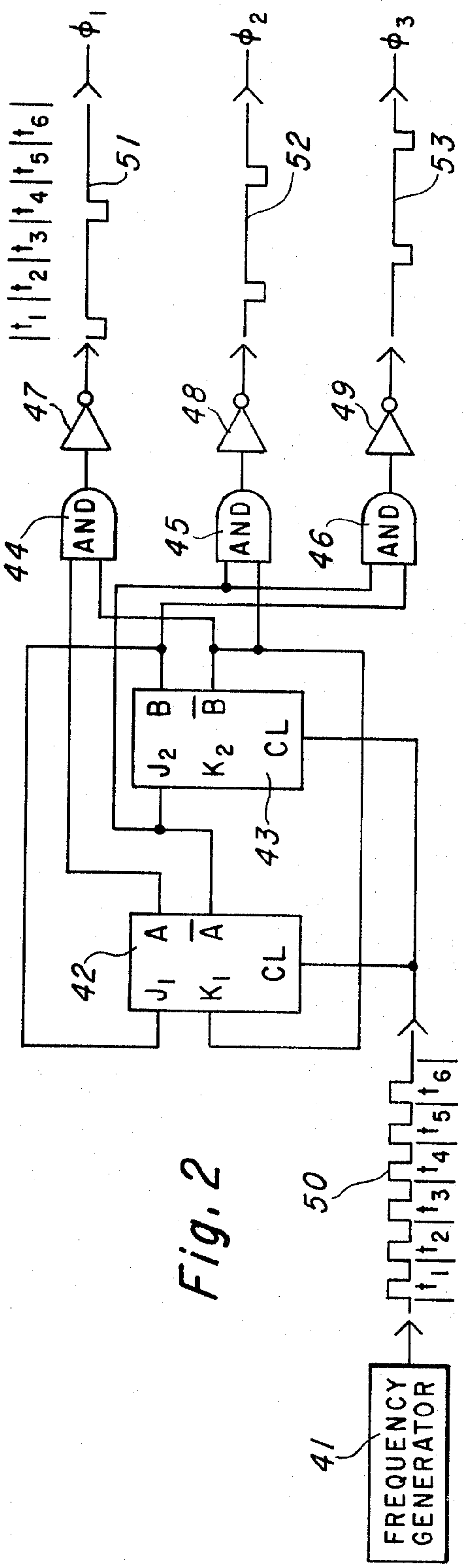
FIG. 2 illustrates means for providing a three-phase signal of a single frequency applied to operate the embodiment of the resistor illustrated in FIG. 1.
FIG. 3 illustrates the operation of the means for providing a three-phase signal illustrated in FIG. 2 over six consecutive time periods.

FIG. 2 illustrates a circuit for providing a three-phase signal of a single frequency to means $\phi_1$, $\phi_2$ and $\phi_3$. Pulses of a particular frequency are produced by frequency generator 41 of signal wave form 50 as illustrated over six consecutive time periods $t_1 - t_6$. Signal 50 is then introduced into the clock (CL) inputs of two J-K flip-flops 42 and 43. Output B of flip-flop 43 is connected to the $J_1$ input of flip-flop 42, the NOT B output $(\bar{B})$ of flip-flop 43 is connected to the $K_1$ input of flip-flop 42 and the NOT A output $(\bar{A})$ of flip-flop 42 is connected to the $J_2$ input of flip-flop 43, thereby providing a divide-by-three counter circuit. Outputs A, $\bar{A}$, B and $\bar{B}$ are gated through AND-gates 44, 45 and 46 to provide the required signals of three different phases. When P channel field effect transistors are used in the resistor of the invention, the signals are inverted by NOT-gates 47, 48 and 49. The output signals 51, 52 and 53, having, for example, pulses of −8 volt potentials from a ground zero potential, are applied to means $\phi_1$, $\phi_2$ and $\phi_3$ respectively to operate the resistor.

The operation of J-K flip-flops 42 and 43 as a divide-by-three counter is illustrated on the chart of FIG. 3 for consecutive time periods $t_1 - t_6$. A J-K flip-flop operates so that if the J input is a logical "0" and the K input is a logical "1," then the output is a logical "0" during the next time period. If the J input is a logical "1" and the K input is a logical "0," then the output is a logical "1" during the next time period. If both the J and K inputs are logical "0"s, then the output remains the same during the following time period, but if both are logical "1"s, then during the following time period the output is the inverse of what it was during the preceding time period.

The outputs A and $\bar{A}$ of flip-flop 42 and B and $\bar{B}$ of flip-flop 43 are gated through AND-gates to obtain a logical "1" pulse which is sequentially applied to means $\phi_1$, $\phi_2$ and $\phi_3$.

Similar circuits provide pulses or four or more different phases by utilization of a divide-by-four counter or divide-by-$(n+1)$ counter.

From a comparison of input signal wave form 50 and output signal wave forms 51, 52 and 53, it is noted that the frequency of the output signals of the particular circuit illustrated in FIG. 2 are $(n + 1)$ times, or in this particular embodiment, three times the frequency of the input signal. Thus, where it is desired to apply signals of frequency "$f$" to means $\phi_1$, $\phi_2$ and $\phi_3$, a frequency of "$3f$" must be provided by frequency generator 41. Conversely, if the circuit is utilized to operate with the transducer feature of the invention, and it is desired to measure the frequency "F" being produced by frequency generator 41, the frequency applied to means $\phi_1$, $\phi_2$ and $\phi_3$ is only "1/3F" $(F/n)$ and the resulting resistance then varies as $$R = F/Cf.$$

Figure 4:
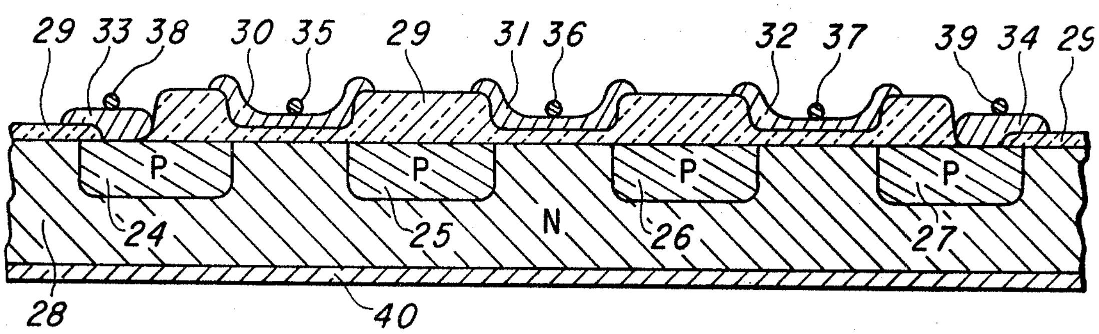
FIG. 4 illustrates a sectional view of a semiconductor embodiment of the circuit illustrated in FIG. 1.

FIG. 4 illustrates a semiconductor embodiment of the invention with three insulated gate, field effect transistors. The resistor is fabricated by starting with a monocrystalline semiconductor wafer 28 of one conductivity type (N, for example). Regions 24, 25, 26 and 27 of opposite conductivity type (P respectively) are then diffused into wafer 28 to form a semiconductor substrate. A layer 29 of insulating material such as an oxide or nitride or combinations thereof of the same semiconductor material as wafer 28 is formed over the substrate. Metal such as aluminum is selectively deposited over insulating layer 29 to form gates 30, 31 and 32, and over areas 33 and 34 where portions of the insulating material have been removed to form terminals 38 and 39 of the resistor of the invention. Terminals 35, 36 and 37 provide means for applying a signal of a single frequency, but of a different phase to each of gates 30, 31 and 32 respectively.

In this embodiment, the source-to-drain interconnections of the series of transistors is accomplished by the formation of single diffused regions 25 and 26.

A layer 40 of metal is formed on the opposite surface of wafer 28. Metal layer 40, in conjunction with regions 25 and 26, provide the tow internal capacitors of the resistor when layer 40 is coupled to ground. Additional capacitance may be achieved by forming additional metal deposits over insulation layer 29 above unused portions of wafer 28, said additional deposits being selectively coupled to regions 25 and 26. If such feature is desired, openings are left in insulating layer 29 above regions 25 and 26 to provide the means for coupling the capacitors to such regions. (This feature is not illustrated in FIG. 4.)

The description specific embodiments contained herein are merely illustrative of the principles underlying the inventive concept. Various modifications of the disclosed embodiments, as well as other embodiments of the invention, will be apparent to persons skilled in the art, without departing from the spirit and scope of the invention.

What is claimed is:

1. A system for determining an unknown frequency of an input signal comprising:

a. input means for applying said input signal of an unknown frequency F to said system;
b. means coupled to said input means for dividing said input signals into a plurality of n output signals of the frequency F/N but of a different phase at n respective output means;
c. a plurality of n insulated gate field effect transistors each having a source region and a drain region wherein:
   i. said plurality of transistors are connected in series with the source region of each subsequent transistor in the series connected to the drain region of each preceding transistor in the series; and wherein
   ii. the source region of the first transistor in the series and the drain region of the last transistor, wherein said unknown frequency is inversely proportional to the effective resistance between said terminals;
d. means coupling each of said output means to the insulated gate of a respective one of said transistors.

2. The system according to claim 1 wherein the effective capacitance of each of said insulated gate field effect transistors is C and wherein said unknown frequency is determined according to the equation $F = n^2/CR$ where $R$ is the measured resistance between said terminals.

3. The system according to claim 1 wherein said output means are coupled to said insulated gates in order wherein the gates of said transistors in series are sequentially pulsed when said n signals of different phases are applied to said gates.

4. The system according to claim 1 wherein said frequency divider means is comprised of a counter coupled to a logic gate decoder housing n output means and wherein the signals provided at each of said n output means corresponds to a gated count from said counter.

5. The system according to claim 1 wherein said plurality of series connected field effect transistors comprise an integrated circuit.

* * * * *